United States Patent
Park et al.

(10) Patent No.: US 7,316,950 B2
(45) Date of Patent: Jan. 8, 2008

(54) METHOD OF FABRICATING A CMOS DEVICE WITH DUAL METAL GATE ELECTRODES

(75) Inventors: Chang Seo Park, Singapore (SG); Byung Jin Cho, Singapore (SG); Narayanan T. Balasubramanian, Singapore (SG)

(73) Assignee: National University of Singapore, Singapore (SG)

( * ) Notice: Subject to any disclaimer, the term of this patent is extended or adjusted under 35 U.S.C. 154(b) by 248 days.

(21) Appl. No.: 10/826,665

(22) Filed: Apr. 16, 2004

(65) Prior Publication Data

US 2004/0245578 A1 Dec. 9, 2004

Related U.S. Application Data

(60) Provisional application No. 60/464,936, filed on Apr. 22, 2003.

(51) Int. Cl.
 *H01L 21/8238* (2006.01)
(52) U.S. Cl. ...................................... 438/199
(58) Field of Classification Search ................ 438/622, 438/287, 228, 592, 198, 199
 See application file for complete search history.

(56) References Cited

U.S. PATENT DOCUMENTS

| | | | |
|---|---|---|---|
| 5,989,950 A * | 11/1999 | Wu | 438/228 |
| 6,255,204 B1 * | 7/2001 | Tobin et al. | 438/592 |
| 6,265,302 B1 * | 7/2001 | Lim et al. | 438/622 |
| 6,352,913 B1 | 3/2002 | Mistry et al. | 438/587 |
| 6,653,698 B2 | 11/2003 | Lee et al. | 257/407 |
| 7,045,406 B2 * | 5/2006 | Huotari et al. | 438/198 |
| 2004/0106261 A1 * | 6/2004 | Huotari et al. | 438/287 |

* cited by examiner

*Primary Examiner*—Carl Whitehead, Jr.
*Assistant Examiner*—Monica D. Harrison
(74) *Attorney, Agent, or Firm*—Pillsbury Winthrop et al.

(57) ABSTRACT

A method of constructing a dual metal gate CMOS structure that uses an ultra thin aluminum nitride ($AlN_x$) buffer layer between the metal gate and gate dielectric during processing for preventing the gate dielectric from being exposed in the metal etching process. After the unwanted gate metal is etched away, the CMOS structure is annealed. During the annealing, the buffer layer is completely consumed through reaction with the metal gate and a new metal alloy is formed, resulting in only a minimal increase in the equivalent oxide thickness. The buffer layer and gate metals play a key role in determining the work functions of the metal/dielectric interface, since the work functions of the original gate metals are modified as a result of the annealing process.

11 Claims, 7 Drawing Sheets

METHOD OF FABRICATING A CMOS DEVICE WITH DUAL METAL GATE ELECTRODES

BACKGROUND OF THE INVENTION

The present application claims priority from U.S. provisional patent application Ser. No. 60/464,936 filed Apr. 22, 2003.

FIELD OF THE INVENTION

The present invention relates generally to methods of fabricating CMOS devices and more particularly to a method of fabricating a CMOS device with dual metal gate electrodes using a consumable thin buffer layer between the metal gate and the gate dielectric.

BRIEF DESCRIPTION OF THE PRIOR ART

In the construction of CMOS devices, doped polysilicon is commonly used for gate electrodes. Polysilicon is convenient because it can be doped to achieved the desired work functions in the two CMOS GATES. However, problems arise as the CMOS device is scaled to smaller dimensions. High resistivity, reduced inversion charge density and transconductance, and undesirable depletion of doped polysilicon gate electrodes can occur, resulting in a detrimental increase in the thickness of the gate oxide layers. There is also a problem with boron penetration by diffusion from the polysilicon into thin gate oxide layers.

As the equivalent gate oxide thickness (EOT) decreases below 1.0 nm, the capacitance connected with the depletion layer in the polysilicon gate becomes an important limiting factor in EOT scaling. Therefore, it is projected that a metal gate and in particular a dual metal gate may be required in 50 nm and smaller gate lengths. In the dual metal gate, an N-MOS metal and a P-MOS metal are used for the dual gates. However, current dual metal gate technology has unsolved problems in process integration, especially in the procedure of lithographically masking and removing the first metal of the dual metal gates deposited on a portion of a wafer without generating etching damage to the gate dielectric. The usual method for fabricating dual metal gate electrodes is to deposit the first metal on top of the gate dielectric. The first metal is then removed by lithographically masking and selective etching from one of the well regions, which may be the n-well or p-well region. After that the second metal is deposited on top of the first metal as well as the exposed dielectric. Unfortunately the etching chemical solutions can also attack and remove a portion of the gate dielectric. This is a practical obstacle in the use of dual metal gate technology in production, even if the right metals are successfully identified. Another method to fabricate dual metal gate electrodes involves the use of ion implantation technology. In this case, a metal is deposited on top of the gate dielectrics, and one of the well regions is covered with photoresist. Ion implantation is then applied to one of the metal electrodes, which changes the work function of the metal. As a result, two different work functions of metal electrodes are obtained. However, the ion implantation can damage the gate dielectric, resulting in degradation of gate dielectric performance.

SUMMARY

Briefly, a preferred embodiment of the present invention includes a method of constructing a dual metal gate CMOS structure that uses an ultra thin aluminum nitride ($AlN_x$) buffer layer with a thickness typically less than 20 nm. The layer lies between the metal gate and gate dielectric during processing for protecting the gate dielectric during the metal gate etching process. After dual metal gates are formed, the CMOS structure is subjected to an annealing temperature. During the annealing, the buffer layer is completely consumed through reaction with the metal gate and new metal alloys are formed that have optimal work functions. The annealing process causes only a minimal increase in the equivalent thickness.

IN THE DRAWING

DETAILED DESCRIPTION OF THE PREFERRED EMBODIMENTS

Figure 1:
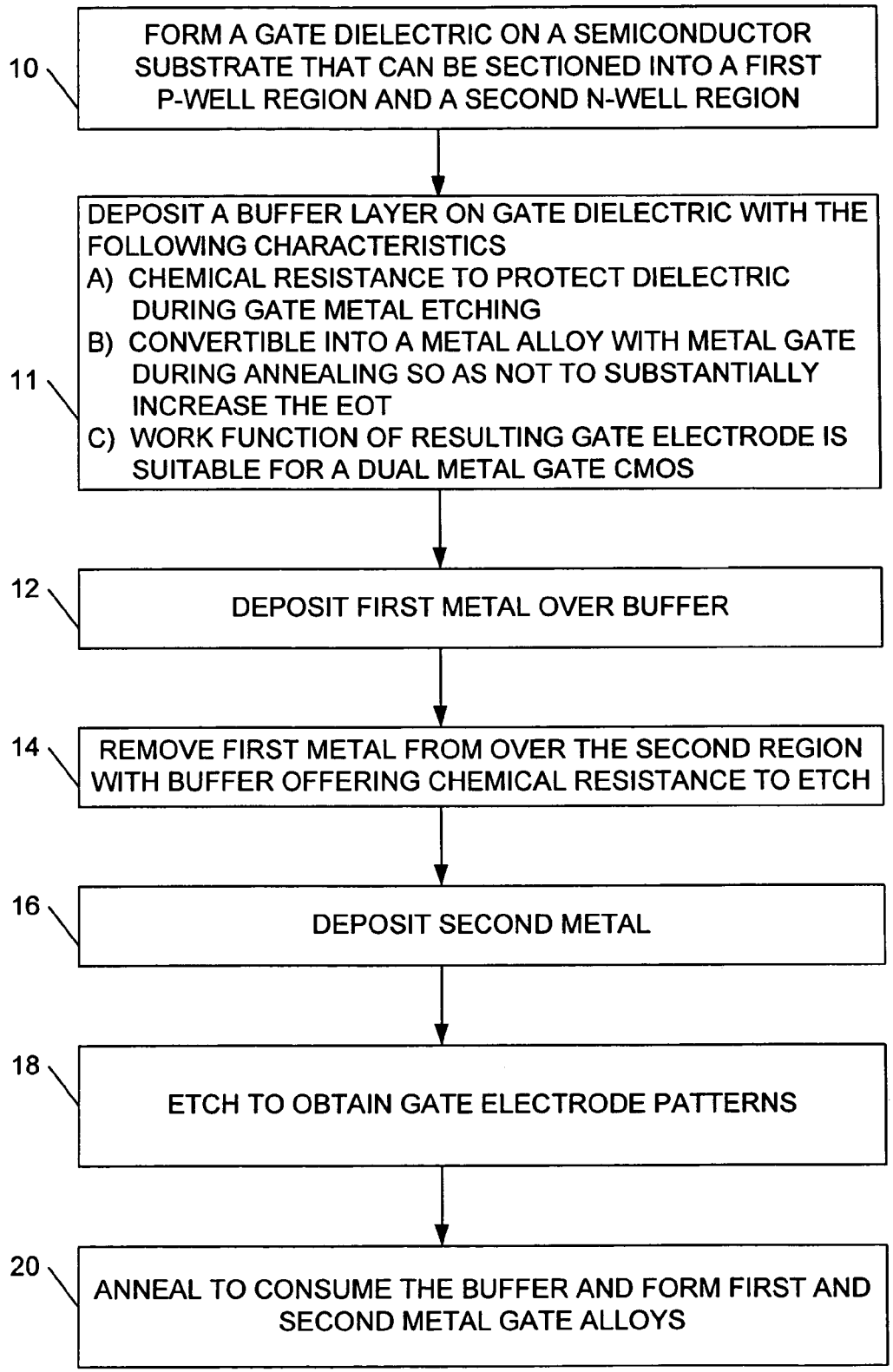
FIG. 1 is a flow chart for describing the method of the present invention.

The method of the present invention is illustrated in the flow chart of FIG. 1. The process/method fabricates dual metal gate electrodes of a CMOS device. This method allows each metal gate electrode to have its optimal work function, namely 4.4 v for NMOS and 4.9 v for PMOS. The process begins (block 10) with forming a gate dielectric 26 on a substrate 22 which has a p-well region and n-well region for use in the formation of NMOSFET and PMOSFET devices in a CMOS. In a preferred embodiment the gate dielectric is thermally grown $S_iO_2$. A buffer layer 28 is then deposited (block 11) on the gate dielectric 26 of the CMOS p and n-well structures. Methods for depositing the buffer layer include physical vapor deposition (PVD), chemical vapor deposition (CVD), atomic layer deposition (ALD), and sputtering. The buffer layer material is selected to meet three criteria: (a) It must be chemically resistant to protect the underlying gate dielectric from exposure to an etchant used during etching of a gate metal that is deposited on the buffer; (b) It must be consumable during annealing so as to form dual metal alloys through reaction with the gate metals during an annealing procedure so that the consumed buffer layer does not increase the final equivalent oxide thickness; and (c) The buffer layer material must be selected so that the work functions of the resulting dual metal gates after annealing are optimal for a dual metal gate CMOS. These criteria are all included in block 11 of FIG. 1. A preferred buffer material is non-stoichiometric aluminum nitride ($AIN_x$) where "x" is in the range of 0.98 to 1.02. A preferred buffer thickness is less than 1.5 nm. Thicknesses larger than 1.5 nm of $AIN_x$ may not completely alloy with the gate metal during anneal, and therefore are not preferred. In one embodiment, a gate metal has a thickness of 100 nm, a gate dielectric has a thickness of 3.5 nm, and $AIN_x$, where "x" is near 1.0, has an initial thickness of approximately 1.0 nm. Other materials that meet the required criteria are also included in the spirit of the present invention. It is highly unusual and unexpected that an insulator such as $AIN_x$ can be alloyed with a metal such as Hf to form a metallic alloy with optimal work functions for CMOS applications.

An $AIN_x$ buffer has a very high chemical resistance against chemical etching. Furthermore it can be react with gate metals that have an electronegativity below 1.34, such as Ti (1.32), Hf (1.23) and Ta (1.33), to form alloys that raise the work function of these metals. For example a Hf—$AIN_x$ alloy has a work function of 4.4 eV, that is optimal for NMOS and a Ta—$AIN_x$ alloy has a work function of 4.9 eV, that is optimal for PMOS.

Referring back to FIG. 1, after depositing the buffer layer, a first metal is deposited over the buffer layer, which notably covers first and second wells (block 12). The first metal is then removed from over the second well (block 14). A preferred first metal is Hf. A preferred method of removal of the unmasked gate metal is by wet chemical etching in solutions known to the state of art, including sulfuric acid and hydrogen peroxide, or a mixture of hydrofluoric acid, hydrogen peroxide and de-ionized water. A second metal is then deposited over the first metal and on the exposed buffer (block 16). A preferred second metal is Ta. After two different metals are deposited, etching using a dry etch process such as RIE is done to obtain gate electrode patterns. (Block 18). This CMOS structure including the remaining first and second metal and underlying buffer material, is then subjected to an anneal, whose temperature and time is selected to cause the consumption of the buffer layer by reacting with the gate metal and therefore forming a metal alloy composed of the buffer material and gate metal (block 20). The anneal temperature should be in the range of 400 to 700° C. with a preferred temperature of 420° C. The selection of gate metal in combination with the selection of buffer material in the process of the method of the present invention, allows control i.e. a determination of the work function of the metal gate electrode. A particular composition ratio of aluminum and nitrogen can be selected in order to determine the resultant gate metal work function i.e., the work function is dependent on the composition ratio of aluminum to nitrogen as well as on the anneal temperature and time. Annealing is conducted in a furnace at 400~500 C for 30 mins, or in RTA tool at 500 to 700 C for 1 min.

Figure 2A:
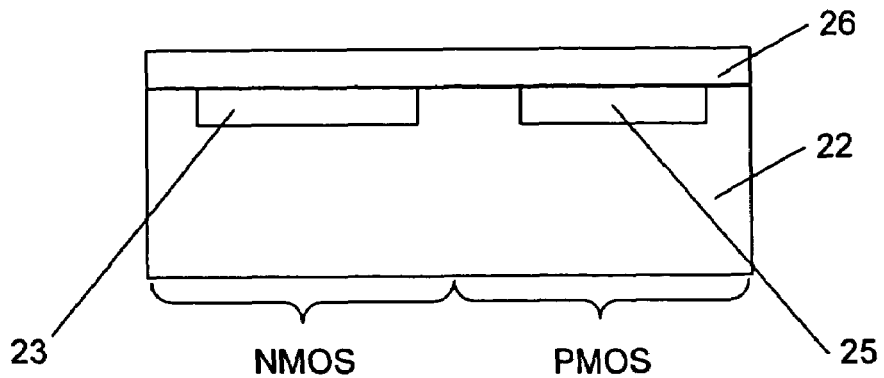
FIG. 2A illustrates the deposition of a buffer layer over a gate dielectric.

The process/method of the present invention will now be described more clearly in reference to FIGS. 2A-2G. FIG. 2A shows a prior art substrate 22 (preferably $S_i$), a gate dielectric 26, and symbolically indicates an NMOS p-well 23 and a PMOS n-well 25. Those skilled in the art will understand how to construct FIG. 2A and variations, all of which are included in the present invention in combination with the gate structure and method of construction as described in reference to FIG. 1 and described in detail below.

Figure 2B:
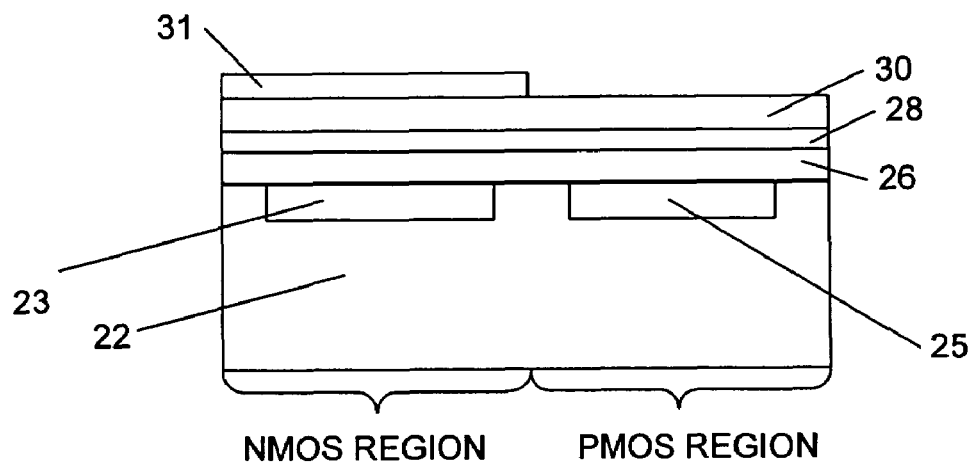
FIG. 2B illustrates deposition of a first metal over the buffer layer, and preparation for removing the first metal from a portion of the buffer layer.

According to the present invention as shown in FIG. 2B, a buffer layer 28 is deposited on the gate dielectric 26. The buffer layer 28 prevents the gate dielectric/gate oxide 26 from being exposed to the metal etching process, and also determines the work functions at the metal/dielectric interface. During the annealing, the buffer layer is completely consumed through reaction with the gate metal, and a new alloy is formed. This process has the additional advantage that there is minimal change in the equivalent oxide thickness of the gate dielectric region. The buffer layer material is selected to meet the requirements discussed in reference to block 11 of FIG. 1. The preferred embodiment of the present invention includes a buffer material of $AIN_x$, with "x" approximately 1.0 in the range of 0.98 to 1.02. One of the buffer material requirements discussed above is that it must convert with the gate metal into a metal alloy during the annealing process. $AIN_x$ can be converted in the annealing process into metal alloys when reacting with metals that have electronegativity below 1.34, such as Ti(1.32), Hf(1.23) and Ta(1.33) to form alloys with altered work functions. Alloys of these metals with $AIN_x$ have work functions substantially higher than that of the bare metals.

Figure 2C:
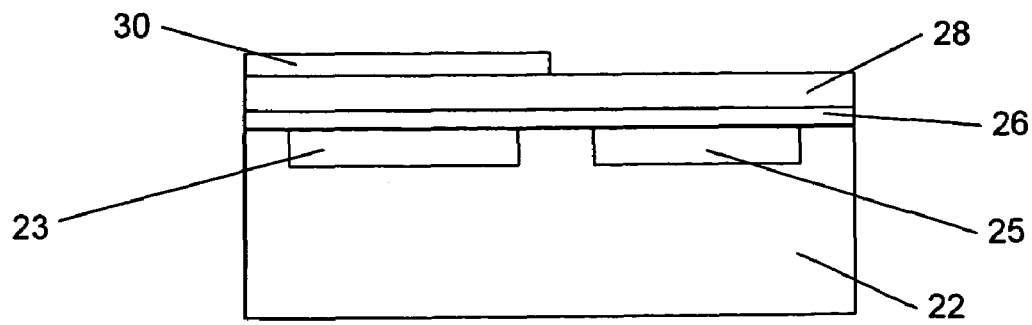
FIG. 2C shows the structure with the unwanted portion of first metal removed.
Figure 2D:
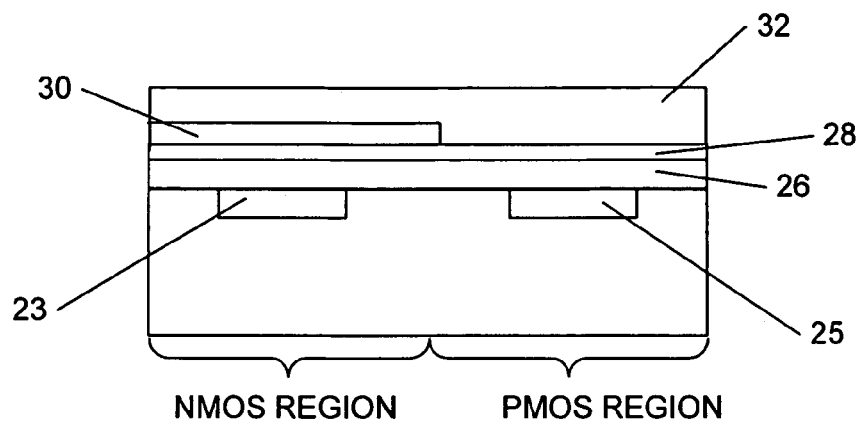
FIG. 2D illustrates deposition of a second metal.
Figure 2E:
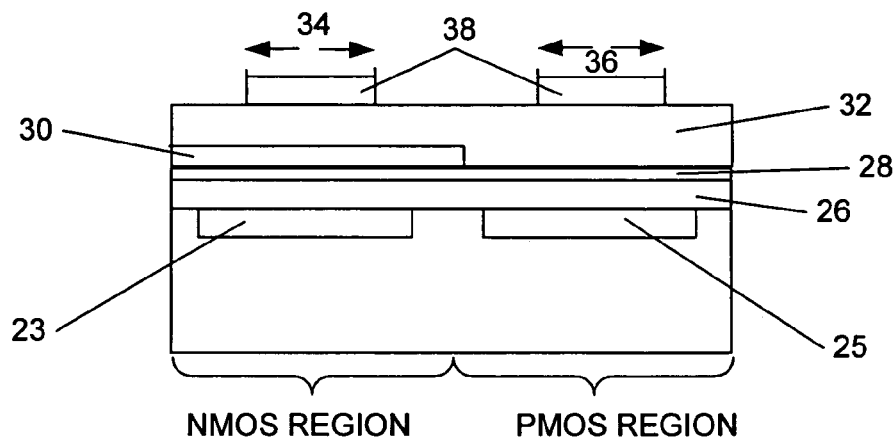
FIG. 2E illustrates preparation for selective etching of the first and second metals and the buffer layer.
Figure 2F:
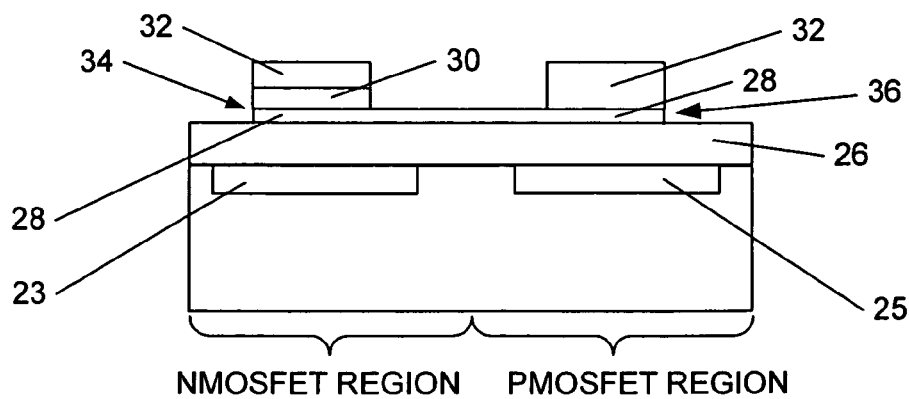
FIG. 2F shows the CMOS structure with the metal removed as mentioned in reference to FIG. 2E.
Figure 2G:
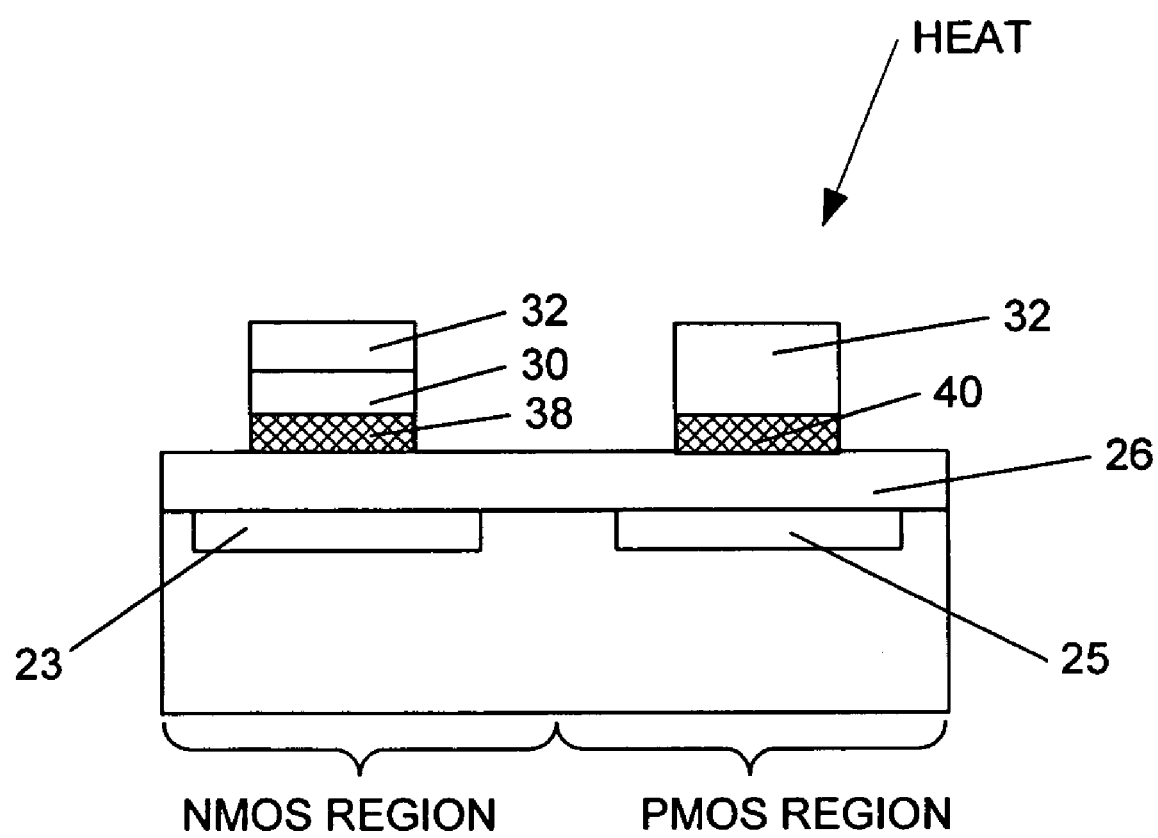
FIG. 2G illustrates annealing and the resultant effect on the buffer layer.

FIG. 2B also illustrates the next step in the process/method wherein a first gate metal 30 is deposited on the buffer layer 28. Metal 30 in the example given is an NMOS metal. This first gate metal could alternatively be a PMOS metal such as Ta (not Hf). Assuming the first metal 30 is an NMOS metal, the NMOS metal must then be removed from over the PMOSFET region. Alternatively, if the first metal were a PMOS metal, it would have to be removed from the NMOSFET region. In the example given, a photoresist 31 is placed over the first metal 30 (NMOSmetal) as shown over the NMOSFET region, and the metal is etched away from over the PMOSFET region, resulting in the structure as illustrated in FIG. 2C. With the NMOS metal removed from the PMOSFET REGION, a PMOS metal 32 is deposited as shown in FIG. 2D, covering the NMOS metal 30 and the PMOSFET area. This is shown planarized in FIG. 2D. The next step is to remove both the PMOSFET and NMOSFET metals, and the buffer layer, except in the NMOS and PMOS gate areas, symbolically indicated as 34 and 36 respectively in FIG. 2E. Those skilled in the art will know of various methods of accomplishing this removal. The method illustrated simply places resist 38 over the two gate areas as shown in FIG. 2E, and etches the remaining exposed metals. The etching of the second metal is different from the first metal etching. The first metal is etched selectively while the second metal etching is only to define the gate electrode pattern. The buffer layer 28 remains after etching as shown in FIG. 2F. However, please note that the buffer layer is consumed by the annealing process, forming alloys 38, 40 with the deposited metal as shown in FIG. 26.

The present invention also includes other methods of achieving the structures of FIG. 2F that use the novel buffer layer 28 for the purpose as disclosed above. The next step is to anneal the structure of FIG. 2F for alloying the buffer layer with the metal layers 30 and 32 for the NMOSFET and PMOSFET gates respectively to consume the buffer layer and form metal alloys, indicated as 38 and 40 in FIG. 2G. The buffer layer 28 has effectively been consumed in the annealing/alloying process.

Figures 3, 4:
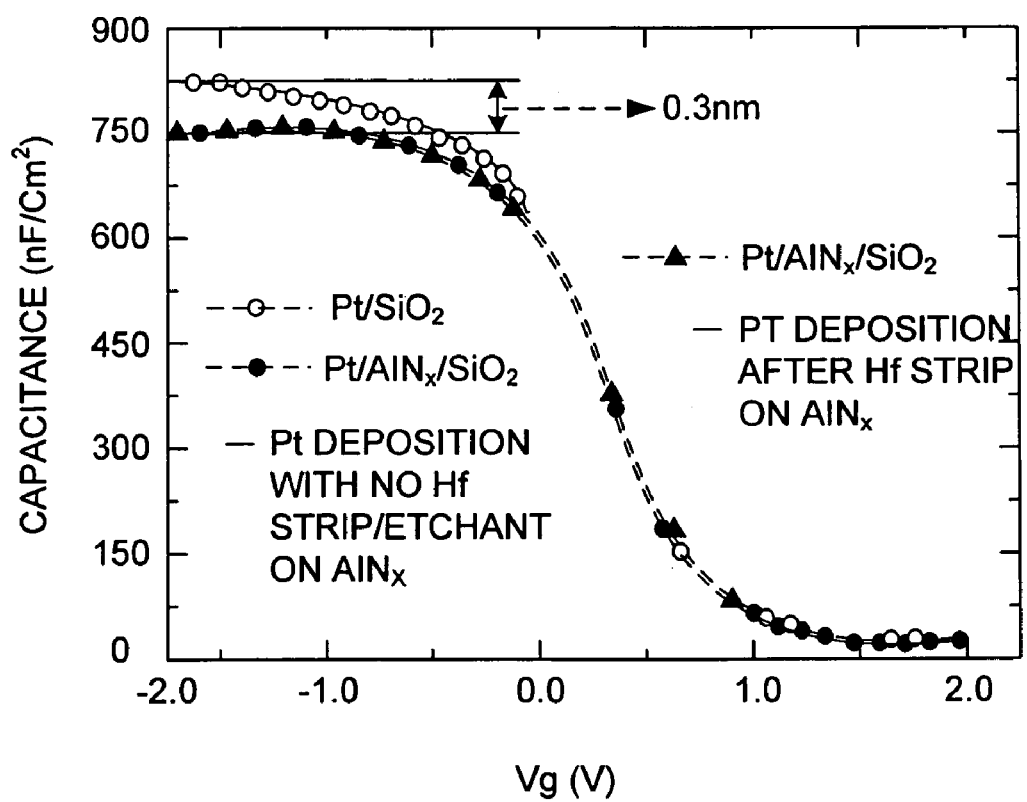
FIG. 3 is a table showing the etching rates of various films.
FIG. 4 is a graph of capacitance versus gate voltage for various platinum (Pt) gates after anneal.

FIG. 3 is presented to show the etching rates of various films. HPM is a mixture of HF, $H_2O_2$ and $H_2O$, and SPM is a mixture of $H_2SO_4$ and $H_2O_2$. As shown, HPM has a very low etch rate on $AIN_x$ compared with Hf or $S_iO_2$. SPM has zero etch rate on $AIN_x$, compared with zero etch rate in $S_iO_2$ and a very high etch rate on Hf.

FIG. 4 includes a curve "-o-" representing the gate capacitance vs. gate voltage of a gate structure having Pt gate metal deposited directly on a $S_iO_2$ gate dielectric, without a buffer layer. The curve "-●-" represents the gate capacitance vs. gate voltage of a gate structure with a Pt gate metal on an $AlN_x$ buffer on a $S_iO_2$ gate dielectric after anneal at 420° C. The structure of curve "-●-" was not exposed to an etchant for removing for example Hf metal, and therefore sets a reference for comparison. The curves indicate a capacitance at −2 V of approximately 820 $nF/cm^2$ for $Pt/S_iO_2$ and 750 $nF/cm^2$ for the $Pt/AlN_x/S_iO_2$ (annealed), which corresponds to a difference in equivalent oxide thickness of 0.3 nm, assuming equal dielectric constants for $AlN_x$ and $S_iO_2$.

The "-▲-" curve represents the gate capacitance vs. gate voltage for a $Pt/AlN_x/S_iO_2$ structure after anneal, but in the construction process was subjected to a wet chemical etch on the $AlN_x$ layer prior to deposition of the Pt layer. This was done to test the effectiveness of the $AlN_x$ layer in resisting the wet etch that is used to remove the portion of the first metal 30. The curves show no significant difference between the "-●-" curve and the "-▲-" curve, indicating that the $AlN_x$ was effective as an etch mask in resisting the wet chemical Hf strip process.

As a further test/evaluation, a $Ta/AlN_x/S_iO_2/S_i$ gate layer was formed and a High Resolution Transmission Electron Microscopy (HRTEM) image was taken showing the thickness of the combined $AlN_x/S_iO_2$ layers before annealing, and after annealing at 420° C. The thickness was 4.24 nm prior to annealing, and 3.50 nm after annealing. The difference of 0.74 nm in thickness before and after anneal, as shown in TEM pictures, showed the consumed AlN. This confirmed the consumption of AlN. It should be noted that the value of 0.74 nm is below 1.5 nm.

Figure 5:
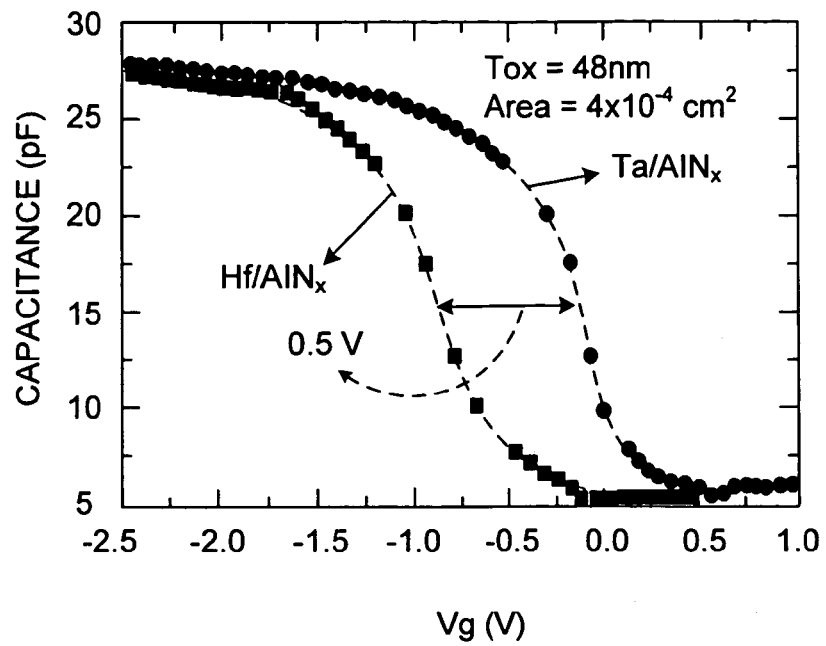
FIG. 5 is a graph of capacitance versus gate voltage for Hf—$AlN_x/S_iO_2$ and Ta—$AlN_x/S_iO_2$ gate after anneal.

FIG. 5 shows curves of gate capacitance versus gate voltage for two structures, one using hafnium (Hf) and the other tantalum (Ta) gate metal. The curves are after a 420° C. anneal, and indicate a maximum difference in the curve of 0.5 V.

Figure 6:
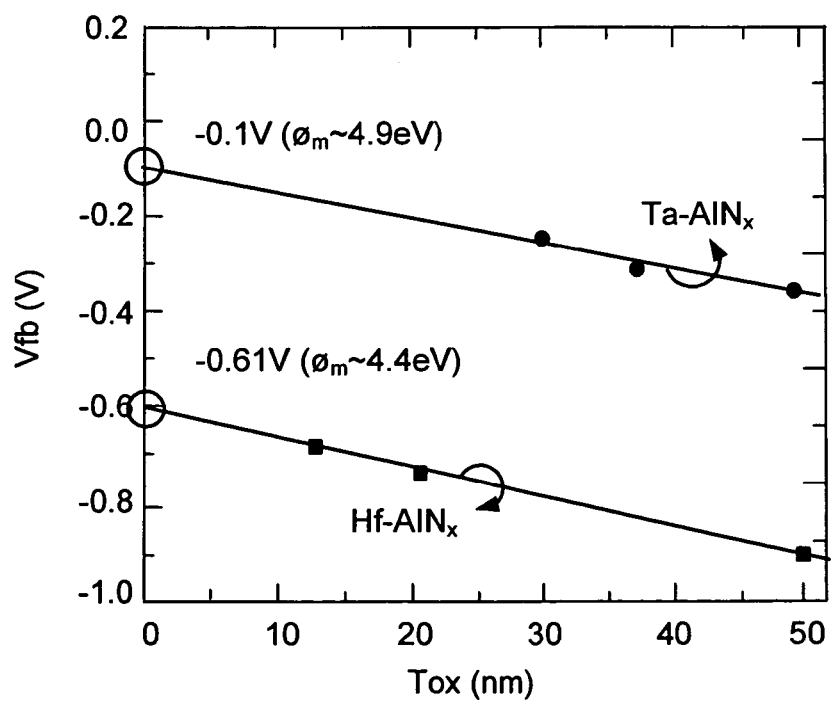
FIG. 6 is a graph of forward gate voltage versus the thickness of the oxide region after anneal, for Ta—$AlN_x$ and Hf—$AlN_x$ gate metals.

FIG. 6 is a plot of the gate forward bias voltage ($V_{fb}$) versus the gate oxide thickness ($T_{Ox}$) for two different gate structures after anneal, both using the $AlN_x$ buffer layer in the process according to the present invention. The evaluated work functions are 4.9 eV with Ta as the gate metal, and 4.4 eV with Hf (hafnium) as the gate metal, again showing ▲∅=0.5 V.

Figure 7:
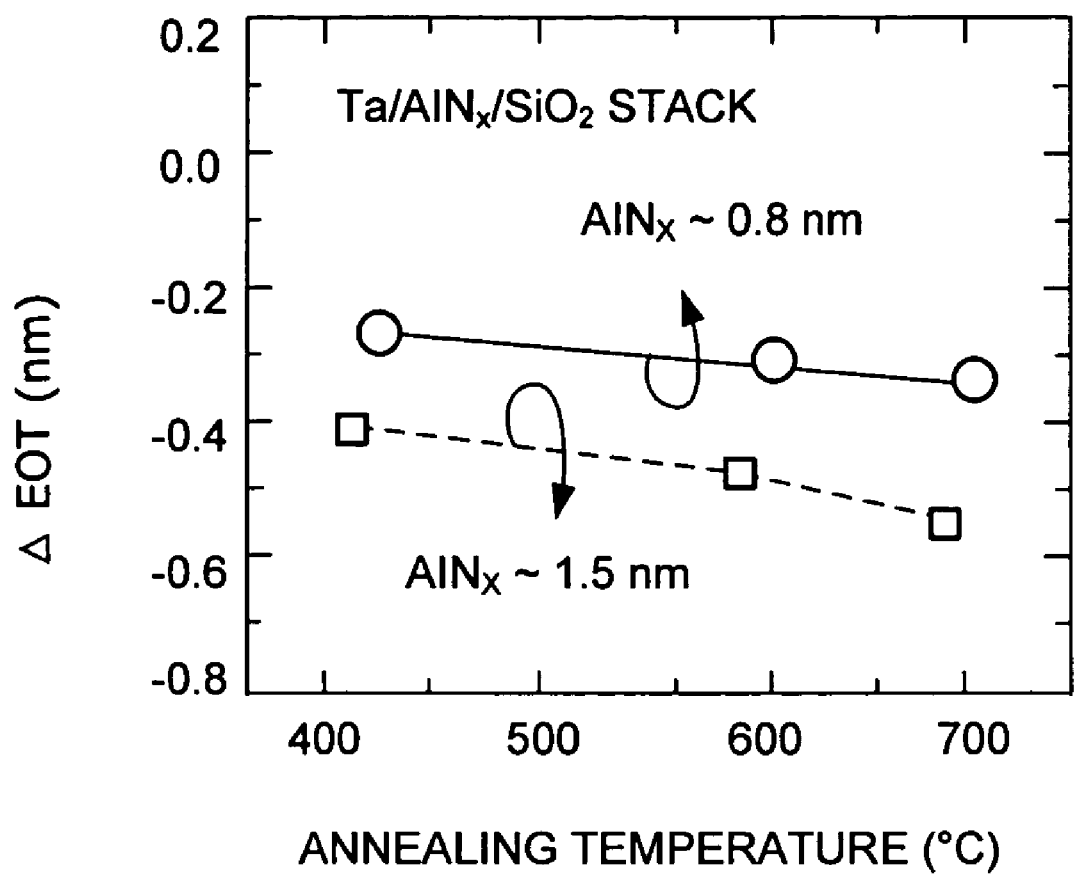
FIG. 7 is a graph of resultant equivalent gate oxide thickness variation as a function of annealing temperature for two different thicknesses of $AlN_x$ buffer layers.

FIG. 7 is a plot of the change in the equivalent oxide thickness resulting from the annealing process for various annealing temperatures and for two different structures, one with a $AlN_x$ thickness of about 0.8 nm and the other with a $AlN_x$ thickness of about 1.5 nm. The graphs show that the equivalent oxide thickness is reduced slightly as a result of the annealing process and reduced more for the thicker structure. The maximum change was about 0.5 nm corresponding to a 700° C. anneal with use of the 1.5 nm $AlN_x$ layer in a $Ta/AlN_x/S_iO_2$ stack.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method of fabricating a CMOS device comprising the steps of:
   (a) forming a gate dielectric on a semiconductor substrate that can be sectioned into a p-well region for forming an NMOSFET and a n-well region for creating PMOSFET;
   (b) forming an aluminum nitride buffer layer material over the gate dielectric;
   (c) depositing a first metal on the buffer layer;
   (d) selectively etching the first metal with a first etchant so that the buffer layer is exposed on one of said p-well and n-well regions;
   (e) depositing a second metal on both the exposed buffer layer and the remaining first metal;
   (f) removing said first metal and said second metal and said buffer layer in selected areas so as to form a PMOSFET gate electrode and an NMOSFET gate electrode of said CMOS device; and
   (g) annealing remaining portions of said first metal and said second metal and said buffer layer to consume said portions of said buffer layer by reacting with said first metal and said second metal to form first and second conductive alloys with first and second work functions respectively.

2. A method as recited in claim 1 wherein said buffer layer material is selected to have a resistance to said first etchant for protecting said gate dielectric from said first etchant.

3. A method as recited in claim 1 wherein said buffer layer has a buffer layer thickness less than 20 nm.

4. A method as recited in claim 1 wherein said first etchant is a wet chemical solution including a mixture of sulfuric acid and hydrogen peroxide.

5. A method as recited in claim 1 wherein said first etchant is a wet chemical solution including a mixture of hydrofluoric acid and hydrogen peroxide.

6. A method as recited in claim 1 wherein said annealing is done at a temperature in excess of 400° C.

7. A method as recited in claim 1 wherein said first metal is hafnium and second metal is tantalum.

8. A method as recited in claim 1 wherein said forming a buffer layer material includes a process selected from the group consisting of physical vapor deposition (PVD), chemical vapor deposition (CVD) and atomic layer deposition (ALD).

9. A method as recited in claim 1 wherein a composition ratio of the aluminum nitride is selected to achieve desired work functions of said metal alloys.

10. A method as recited in claim 1 wherein the first metal and second metal are selected from the group consisting of titanium (Ti), hafnium (Hf) and tantalum (Ta).

11. A method as recited in claim 1 wherein the first metal and second metal have an electronegativity of less than 1.34.

\* \* \* \* \*